United States Patent [19]

Doorman et al.

[11] Patent Number: 4,849,080
[45] Date of Patent: Jul. 18, 1989

[54] METHOD OF MANUFACTURING AN OPTICAL STRIPLINE WAVEGUIDE FOR NON-RECIPROCAL OPTICAL COMPONENTS

[75] Inventors: Volker Doorman; Jens-Peter Krumme, both of Hamburg, Fed. Rep. of Germany

[73] Assignee: U.S. Philips Corporation, New York, N.Y.

[21] Appl. No.: 51,568

[22] Filed: May 18, 1987

[30] Foreign Application Priority Data

May 21, 1986 [DE] Fed. Rep. of Germany ....... 3617060
Feb. 12, 1987 [DE] Fed. Rep. of Germany ....... 3704378

[51] Int. Cl.⁴ .................... C23C 14/06; C23C 14/34; C23C 14/54
[52] U.S. Cl. .................... 204/192.15; 204/192.3; 204/192.26
[58] Field of Search .................... 204/192.15, 192.18, 204/192.26, 192.3, 192.31, 192.29

[56] References Cited

U.S. PATENT DOCUMENTS

| | | | |
|---|---|---|---|
| 3,607,698 | 9/1971 | Kensington et al. | 204/192.15 |
| 3,825,318 | 7/1974 | Croset et al. | 204/192.26 |
| 3,928,092 | 12/1975 | Ballamy et al. | 204/192.31 X |
| 3,997,690 | 12/1976 | Chen | 204/192.26 X |
| 4,322,276 | 3/1982 | Meckel et al. | 204/192.26 |
| 4,376,138 | 3/1983 | Alferness et al. | 427/160 |
| 4,413,877 | 11/1983 | Suzuki et al. | 204/192.26 X |
| 4,608,142 | 8/1986 | Gomi et al. | 204/192.26 X |

*Primary Examiner*—Donald R. Valentine
*Attorney, Agent, or Firm*—Paul R. Miller

[57] ABSTRACT

A method is disclosed of manufacturing an optical stripline waveguide for use in non-reciprocal optical components, in which a monocrystalline waveguide strip having a refractive index $n_2$, which is surrounded by material with a lower refractive index $n_1$, is provided on a monocrystalline substrate, the waveguide strip and the material surrounding it being deposited on a substrate by means of RF cathode sputtering (sputter epitaxy) in an inert gas plasma, making use of a target which contains mainly iron garnet phase, together with other phases with an almost equal sputtering rate, the crystal lattice of said substrate being locally disturbed in the surface regions where no waveguide strip is to be grown, thereby forming a lattice disorder.

31 Claims, 4 Drawing Sheets

METHOD OF MANUFACTURING AN OPTICAL STRIPLINE WAVEGUIDE FOR NON-RECIPROCAL OPTICAL COMPONENTS

The invention relates to a method of manufacturing an optical stripline waveguide for non-reciprocal optical components, in which a monocrystalline waveguide strip with a refractive index $n_2$, which is surrounded by material with a lower refractive index $n_1$, is provided on a monocrystalline substrate.

In optical transmission lines light is conducted either in optical waveguides in the form of optical fibres or in planar waveguides which are constructed as stripline waveguides with a refractive index stop towards smaller values in the material surrounding the waveguide strips. With respect to this matter, reference is made to R. G. Hunsperger, "Integrated Optics": Theory and Technology, Springer-Verlag, 1982, in particular pp. 38–69. The planar stripline waveguides can be constructed as strip-loaded waveguides, page 43 FIG. 1a), ridged waveguides, page 66 FIG. 1b) or channel waveguides, page 38 (FIG. 1c). These embodiments are determined inter alia by the present state of the art.

The present method is particularly suitable for the manufacture of ridged waveguides and channel waveguides as well as for the manufacture of semi-leaky optical isolators. In the case of semi-leaky isolators the forward wave of the incoming light passes the isolator without attenuation (for example TM-mode), whereas reflected waves are leaked out (formation of TE-modes).

The known stripline waveguides are produced with materials which have so far been used in integrated optics, such as $LiNbO_3$, or on the basis of $A^{III}B^V$ compounds, In particular for non-reciprocal optical waveguides the use of iron garnet has proved to be particularly suitable. So far it has not been possible to manufacture stripline waveguides on the basis of iron garnet in a quality which satisfies the requirements.

Planar iron garnet waveguides are envisaged, for example, as optical isolators in coherent transmission networks at frequencies $>10^2$ MHz; in this respect, reference is made to I.E.E.E. J. Quantum Electro. QE-18, 1982, page 1975, A channel waveguide must satisfy the following requirements: waveguide strips should optimally have thicknesses of a few $\mu m$. In order to permit waveguide strip thicknesses of a few $\mu m$, the step size value of the refractive index $n_2-n_1$ relative to the material surrounding the waveguide strips must be in the order of some $10^{-3}$ when a single-mode propagation is to be attained in the stripline waveguide. When the step size value of the refractive index between the material of the waveguide strip ($n_2$) and the surrounding material ($n_1$) is so low the light wave will leak deeply into the surrounding material, so that in order to obtain small losses in the waveguide strip not only the waveguide strip itself but also the surrounding material must exhibit a very low degree of intrinsic absorption $\alpha$ and a very low degree of light scattering ($<1$ dB/cm).

It is an object of the invention to provide a method by means of which stripline waveguides and in particular semi-leaky optical isolators can be manufactured on the basis of iron garnet, which exhibit a low degree of intrinsic absorption $\alpha$ and have adjustable values of the refractive index step $n_2-n_1$ in combination with limited other losses.

This object is achieved according to the invention, in that the waveguide strip and the material surrounding it are deposited on a substrate by means of RF-cathode sputtering (sputter epitaxy) in an inert gas plasma, making use of a target which contains mainly an iron garnet phase, together with other phases with an almost equal sputtering rate, the crystal lattice of this substrate being locally disturbed in the surface regions on which no waveguide strip should grow, thereby forming a lattice disorder. Apart from the iron garnet phase there may also be other phases, for example orthoferrite or $Fe_2O_3$.

The invention is based on the recognition that sputter epitaxy of, for example, complex layers which consist of elements having a very different sputtering rate can be carried out when monocrystalline substrates having well-defined, undisturbed surfaces and targets having phases with an almost equal sputtering rate are used, and when the RF cathode sputtering process is carried out in an inert gas plasma, preferably a helium group gas plasma, making use of preferably a magnetron electrode.

According to further advantageous embodiments of the method according to the invention, a (111)-oriented non-magnetic garnet single crystal disc is used as a substrate, or a (110)-oriented non-magnetic garnet single-crystal disc is used as a substrate; preferably, the single-crystal discs consist of calcium magnesium zirconium-substituted gadolinium gallium garnet $(Gd,Ca)_3(Ga, Mg,Zr)_5O_{12}$. However, other non-magnetic gallium garnet substrates may be used as well. In particular the use of a (110)-oriented garnet single crystal disc provides the possibility of producing an optical isolator having a strain-induced optical bi-refringence in the (plane of the) layer. By means of twin-crystal-rocking-X-ray curves it has been found that the mono-crystalline layers deposited on such a substrate have a satisfactory X-ray line width, even when there is a high crystal lattice misfit of approximately 1% between the substrate and the deposited monocrystalline layer, which is interesting for isolators having semi-leaky properties.

According to a further advantageous embodiment of the inventive method, the monocrystalline waveguide strip and the material surrounding it have a composition according to the general formula $(A,B)_3(A,B)_5O_{12}$, where A=at least one rare earth metal, Bi,Pb and/or Ca and B=Ga,Al,Fe,Co,Ni,Mn,Ru,Ir,In and/or Sc.

Unlike, for example, liquid phase epitaxy processes, the sputter epitaxy process is carried out in a state of thermochemical non-equilibrium, consequently the manufacture of, for example, garnet layers in non-equilibrium compositions is possible without using a foreign phase.

For example, single-phase iron garnet material in the form of monocrystalline waveguide strips and differently ordered (amorphous or polycrystalline) material surrounding them of the following compositions were manufactured:

1. $Gd_{1.90}Bi_{1.45}Fe_{4.09}Al_{0.34}Ga_{0.22}O_{12}$
2. $Gd_{1.97}Bi_{1.04}Fe_{4.51}Ga_{0.22}Al_{0.26}O_{12}$.

According to further advantageous embodiments of the inventive method, the material which laterally surrounds the waveguide strip is amorphous or polycrystalline. Polycrystalline material is to be preferred when low degrees of absorption are required.

According to advantageous embodiments of the method according to the invention, the substrate is heated in the epitaxy process to a temperature which is higher than the temperature at which epitaxial growth on substrate regions having an undisturbed crystal lattice starts, and which is lower than the temperature at which polycrystalline growth on substrate regions having a distrubed crystal lattice starts; preferably, the substrate is heated to a temperature in the range from 450° to 520° C.

According to a further advantageous embodiment of the invention method, the substrate heated in the epitaxy process to a temperature which is higher than the temperature at which polycrystalline growth on substrate regions having a distrubed crystal lattice starts; preferably, the substrate is heated to a temperature of >520° C.

At temperature over 450° C. it becomes possible to deposit a layer consisting of regions of different order, namely amorphous or polycrystalline layer regions and monocrystalline garnet layer regions, on a monocrystalline garnet substrate having a locally disturbed lattice structure. The substrate temperature to be selected depends upon the desired composition of the layer to be formed and upon its order and it must be established empirically.

In a sputter epitaxy process the substrate temperature during the deposition process plays a part: a higher substrate temperature favours a spontaneous crystallization of the deposited layer; in this respect it was found that epitaxial growth on substrate regions having an undisturbed crystal lattice starts at lower temperatures than polycrystalline growth on substrate regions having a disturbed crystal lattice. In other words, $T_{epitaxial\ growth} < T_{polycrystalline\ growth}$. Hereinafter these temperatures will be designated $T_{epi}$ and $T_{poly}$, respectively. When substrates are used whose crystal lattices were at the surface locally converted to a condition of disorder, for example by an iron bombardment, an amorphous or dependent on the substrate temperature, a polycrystalline layer is deposited on the disturbed substrate regions by the cathode sputtering process, whereas on the undisturbed, monocrystalline regions the material deposited by cathode sputtering grows as a monocrystalline layer. In other words, the substrate temperature T for the manufacture by means of sputter epitaxy of a structured layer having monocrystalline and, next thereto, amorphous layer regions is to be selected so that: $T_{epi} < T_{substrate} < T_{poly}$.

The substrate temperature T for the manufacture of monocrystalline waveguide strips with, next thereto, polycrystalline material must be selected so that: $T_{substrate} > T_{poly}$. When the substrate is heated to a temperature below that at which epitaxial growth starts, only amorphous layers are deposited, independent of whether the substrate has a disturbed or an undisturbed crystal lattice.

In the manufacture of stripline waveguides on the basis of iron garnet by means of RF-cathode sputtering, it has been found that the iron garnet material grows in a monocrystalline manner on monocrystalline garnet substrates when the substrates are heated to a temperature $\geq 450°$ C.

When layers on the basis of iron garnet are deposited on substrates which are not monocrystalline in, at least, near-surface regions such as, for example, disturbed monocrystalline or amorphous substrates, amorphous to X-ray amorphous layers are formed at a substrate temperature below approximately 520° C., and polycrystalline layers are formed at substrate temperature >520° C.

According to an advantageous embodiment of the inventive method, the deposition of the waveguide-strip forming material is preceded by the deposition of a monocrystalline iron garnet layer of the same material by means of RF cathode sputtering, which layer is provided with a refractive index $n_1$ which is lower than the refractive index $n_2$ of the waveguide strip because in comparison with the conditions under which the monocrystalline waveguide strip is deposited a higher RF voltage is applied to the target electrode and/or the pressure of the inert gas plasma is increased and/or the substrate temperature is raised and/or an RF voltage 6 (substrate bias) is applied to the substrate electrode.

According to an advantageous further embodiment of the inventive method, the deposition of the material forming the waveguide strip is followed by the deposition of a further iron garnet layer of the same material by means of RF cathode sputtering, which layer grows in a monocrystalline manner on the waveguide strip and in an amorphous or polycrystalline manner on the material which laterally surrounds this strip, and which layer is provided with a refractive index $n_1$ which is lower than the refractive index $n_2$ of the waveguide strip, because in comparison with the conditions under which the monocrystalline waveguide strip is deposited a higher RF voltage is applied to the target electrode and/or the pressure of the inert gas plasma is increased and/or the substrate temperature is raised and/or an RF voltage (substrate bias) is applied to the substrate electrode.

According to a further advantageous embodiment of the inventive method, the material which laterally surroundes the waveguide strip is removed in a subsequent etching step, and by means of RF cathode sputtering a further monocrystalline iron garnet layer of the material forming the waveguide strip is deposited next to and on the waveguide strip, which is provided with a refractive index $n_1$ which is lower than the refractive index $n_2$ of the waveguide strip because an inert gas plasma is used having a pressure, preferably in the range from 0.2 to 2.0 Pa at an iron energy from approximately 10 to $10^2$ eV, which is higher than that of the inert gas plasma used to deposit the waveguide strip. A lower refractive index $n_1$ of the further monocrystalline iron garnet layer can also be obtained by raising the RF voltage which is applied to the target electrode or by raising the substrate temperature or by applying a RF voltage (substrate bias) to the substrate electrode. All four measures lead to an increase of the selective back-sputtering rate of the elements involved in the formation of the layer and having very low sputtering rates (for example bismuth). As the etching rate of amorphous iron garnet material in, for example, a chemical etching process in $H_3PO_4$ and at a temperature of 150° C. is approximately 5 times that of monocrystalline iron garnet material, and the etching rate of a non-magnetic gadolinium garnet substrate is a factor of two lower than that of monocrystalline iron garnet, the material surrounding the monocrystalline waveguide strips in the form of amorphous iron garnet can be quantitatively removed without damaging the monocrystalline waveguide strips. As described above, the mono-crystalline waveguide strips must be surrounded by material having a refractive index which is lower for the desired mode of the incoming-light and, in the case of a semi-leaky optical isolator, higher for the modes which are complementary to the desired mode. This can be obtained by depositing the further monocrystalline iron garnet layer after the amorphous material surrounding the monocrystalline waveguide strips has been removed.

Dependent upon the height of the pressure of the inert gas plasma maintained during the epitaxial deposition, the particle bombardment of the growing layer takes place at a reduced and varying intensity, which leads to a modification of small back-sputtering effects. A lower pressure of the inert gas plasma leads to a lesser particle bombardment of the growing layer due to the higher plasma density, and to a more uniform composition of the deposited target layer. If the pressure of the inert gas plasma is slightly decreased, the composition of the deposited layer changes due to the decrease in particle bombardment. This phenomenon is used to deposit in an epitaxial manner iron garnet material which due to the back-sputtering effects has a slightly different composition, and hence, different refractive indices $n_2$ or $n_1$. In the case of magnetron-sputtering these effects are more conspicuous only in the amorphous iron garnet, because apparently the surface binding energy of certain components is less than in crystalline material.

According to advantageous embodiments of the inventive method, a monocrystalline cobalt-substituted iron garnet layer is deposited as an absorbing layer, preferably by means of liquid phase epitaxy, on the single crystal disc which forms the substrate, or an amorphous iron garnet layer whose composition corresponds to that of the waveguide strip is deposited as an absorbing layer on the further iron garnet layer by means of RF cathode sputtering, to which layer a refractive index $n_3$ is imparted which is equally high or higher than the refractive index $n_1$ of the further iron garnet layer, because in comparison with the conditions under which the further iron garnet layer is deposited a lower inert gas plasma pressure is applied, preferably in the range from 0.1 to 1 Pa, and/or a lower substrate temperature is used, preferably in the range from 200° to 450° C. The proper functioning of single-mode waveguides renders imperative the suppression of undesired modes. The material which acts as an absorber does not have to fully surround the stripline waveguide, it is sufficient when an absorbing layer is provided over or underneath the layer structure which forms the stripline waveguide.

According to advantageous embodiments of the inventive method, the monocrystalline waveguide strip and the material surrounding it are deposited in an inert gas plasma having a pressure from 0.2 to 2.0 Pa, and the further iron garnet layer is deposited in an inert gas plasma of the same pressure range, yet at a pressure which is higher than the pressure used to deposit the waveguide strip.

According to a further advantageous embodiment of the inventive method, the lattice structure of the substrate in the form of a garnet single crystal disc or the lattice structure of the monocrystalline absorbing layer provided on an undisturbed garnet single crystal disc or the lattice structure of a first monocrystalline iron garnet layer provided on an undisturbed monocrystalline absorbing layer is disturbed to a depth of a few atom layers by an ion bombardment from an inert gas plasma in the regions on which no waveguide strip should grow in an epitaxial manner. A sputter-etching process (iron bombardment from the plasma) at relatively low RF voltages and relatively low sputtering gas pressures can suitably be used to so disturb the lattice structure of a monocrystalline substrate, which is to be coated epitaxially by means of cathode sputtering, in near-surface regions to a depth of only a few atom layers that dependent upon the substrate temperature instead of a monocrystalline layer a layer of different order, preferably an amorphous or polycrystalline layer, is grown on the disturbed regions, next to a monocrystalline layer on the undisturbed regions of the substrate. This has the advantage that the same arrangement can be used during the entire process, and that a sufficient lattice imperfection is obtained with a depth of only a few atom layers. Preferably, the regions which are not to be disturbed by ion bombardment are covered with a photoresist mask, after which the ion bombardment is carried out in a helium-group gas plasma at a pressure from 0.1 to 1 Pa and an iron energy $>30$ eV.

According to a further advantageous embodiment of the inventive method, a magnetron is used as a target electrode, to which the RF power necessary for the sputtering process is applied. The use of a magnetron results in a concentration of the plasma near the target, and consequently in a substantial reduction or the ion bombardment of the growing layer, so that, for example, the layer will not be subject to back-sputtering effects which adversely affect the epitaxial growth. When a magnetron electrode is used, a maximum concentration of the plasma near the target can be obtained by selecting a phase composition for the target to be sputtered which exhibits the smallest possible saturation magnetization. The use of a magnetron has the additional advantage that in comparison with methods which employ RF cathode sputtering devices in a diode arrangement, the distance between target and substrate can be optimized, i.e. the lowest possible plasma density and smallest possible amount of kinetic energy in the vicinity of the substrate in combination with the highest possible deposition rate.

According to an advantageous embodiment of the inventive method the system consisting of a substrate, a monocrystalline waveguide strip and amorphous material surrounding the latter is subjected to a tempering process at a temperature at which lateral epitaxial growth takes place from the sides of the waveguide strip to the amorphous material surrounding it, such that along the sides of the waveguide strip a monocrystalline cladding having a thickness of several $\mu$m is formed. Also in this way monocrystalline waveguide strips are obtaining having steep, homogeneous, smooth and abrupt interfaces with the surrounding amorphous material.

Advantageously, the tempering process is carried out within a temperature range of about 50 K. below the crystallization temperature of the amorphous material. Thus, the value of the absorption $\alpha_1$ of the amorphous iron garnet material approaches the absorption $\alpha_2$ of the monocrystalline iron garnet material, which in the case of a lightwave leaking into the stripline waveguide leads to a reduction of the propagation losses. Due to the similarity in the composition of the amorphous layer the refractive index is graded in conformity with the crystallized material.

The method according to the invention provides the following advantages:

The present method permits the manufacture in one production cycle and by means of an epitaxial deposition process of optical stripline waveguides, in particular of the buried channel waveguide type having isolating properties, in which the stripline waveguides obtained are homogeneous through the entire cross-section regarding structure, refractive index and magnetical properties; they exhibit a high geometric resolution, and in particular smooth, steep interfaces between monocrystalline material and material of a different order, (amorphous or polycrystalline).

In the wavelength range over 1 μm the interface between amorphous and monocrystalline ranges exhibits a refractive index step which can be set towards smaller values thanks to the present method and which is necessary to propagate the waves in monocrystalline waveguide strips. The intrinsic absorption α of the monocrystalline iron garnet produced by RF cathode sputtering is very low in the wavelength range over 1 μm; by means of a propagation method a total loss α of $<0.15$ $cm^{-1}$ was measured in the plane of the layer at a wavelength of 1.33 μm, which loss includes the leakage of the planar waveguide. The interface between amorphous and monocrystalline material is very smooth and steep, which also in the waveguide strip leads to a low degree of leakage. The geometric resolution of the structures formed with the present method is of the order of $<\pm 1.5$ μm.

A further advantage of the present method is that apart from material of different order (amorphous or polycrystalline) a single arrangement can be employed for the manufacture in one production cycle of monocrystalline waveguide strips, said arrangement being used both for the preparation of the substrates to be coated (ion bombardment) and for the manufacture of the iron garnet layers, which from the point of view of efficiency is important in a manufacturing process.

A further advantage of the present method is that, in contrast to the liquid phase epitaxy, very thin homogeneous layers can be manufactured without transition layers being formed.

Yet another advantage of the present method is, for example, that for the manufacture of iron garnet layers on a non-magnetic substrate, matching the lattice constants of the substrate and the layer is easier than in the case of, for example, liquid phase epitaxy; lattice mismatches $>1\%$ are acceptable. Such mismatches are even required when optical isolator concepts having semi-leaky properties have to be obtained.

RF cathode sputtering can be carried out by means of commercially available RF voltage-operated cathode sputtering devices having a target cathode (magnetron) which is provided with a magnetic system and which has a diameter of for example 7.6 cm, a device for measuring the effective RF voltage both at the target electrode and the substrate electrode having to be provided. The magnetron cathode is provided vertically in an ordinary vacuum recipient. An RF generator supplies the RF power necessary for the sputtering process to the target electrode and the substrate electrode through impedance matching elements, and subsequently to the plasma. The stabilization of the RF voltage on the target electrode at values smaller than $\pm 1\%$ is obtained via a computer control. The pressure of the sputtering gas is also kept constant to $\pm 1\%$ by a computer control. An ordinary RF generator is used as an energy source for the sputtering arrangement, which generator is operated at an output power of 200 W. The operating frequency is 13.56 MHz.

The invention will now be explained in more detail by means of exemplary embodiments.

DETAILED DESCRIPTION OF THE DRAWING

Figure 1A:
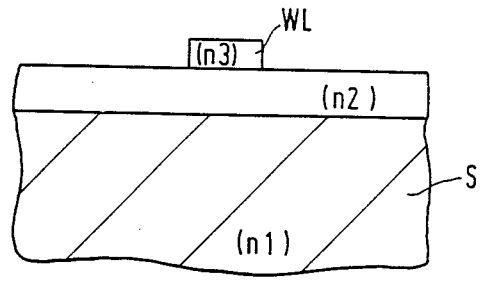
FIGS. 1a to 1c show types of stripline waveguides according to the present state of the art.
Figure 1B:
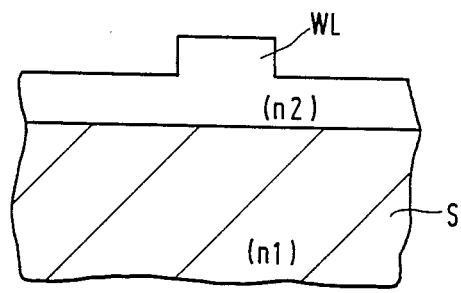
Figure 1C:
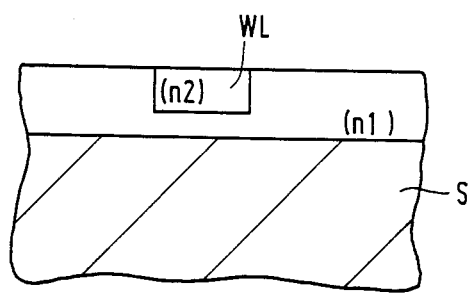

FIGS. 1a to 1c are schematic sectional views of types of stripline waveguides according to the present state of the art (FIG. 1a: strip-loaded waveguide, FIG. 1b: ridged waveguide, FIG. 1c: channel waveguide). WL denotes the waveguide strip, S denotes the substrate. The stripline waveguides shown are made of materials having refractive indices $n_1$, $n_2$ and $n_3$, where $n_3 \gtrsim n_2 > n_1$.

Figure 2:
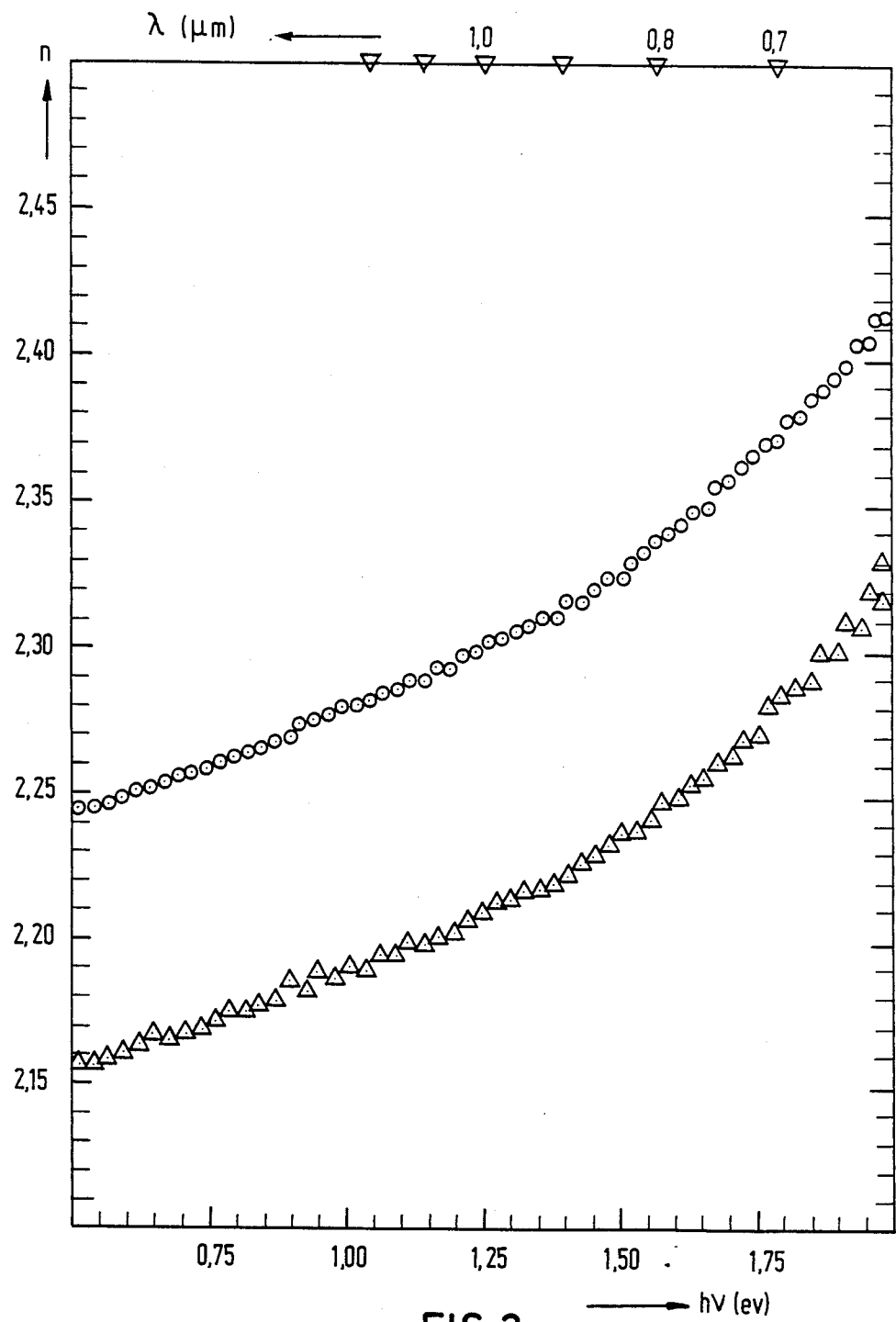
FIG. 2 is a diagram of refractive indices of the materials used in a stripline waveguide according to the invention.

FIG. 2 depicts the refractive index n of monocrystalline (circles) and amorphous (triangles) bismuth-substituted gadolinium iron garnet which is deposited in situ, a part of the iron being substituted by aluminium and gallium, as a function of the wavelength $\lambda$ (μm) and the photon energy $h_\nu$ ($e_\nu$).

The Figure shows that the interface between amorphous and monocrystalline material for the stripline waveguide relevant wavelength range over 1 μm exhibits a refractive index step towards smaller values, as is required for propagating waves in monocrystalline waveguide strips. According to the present method this refractive index step can be adjusted, i.e. it can also be reduced to very small values as is required in the case of single-mode waveguides having a greater thickness.

Figure 3:
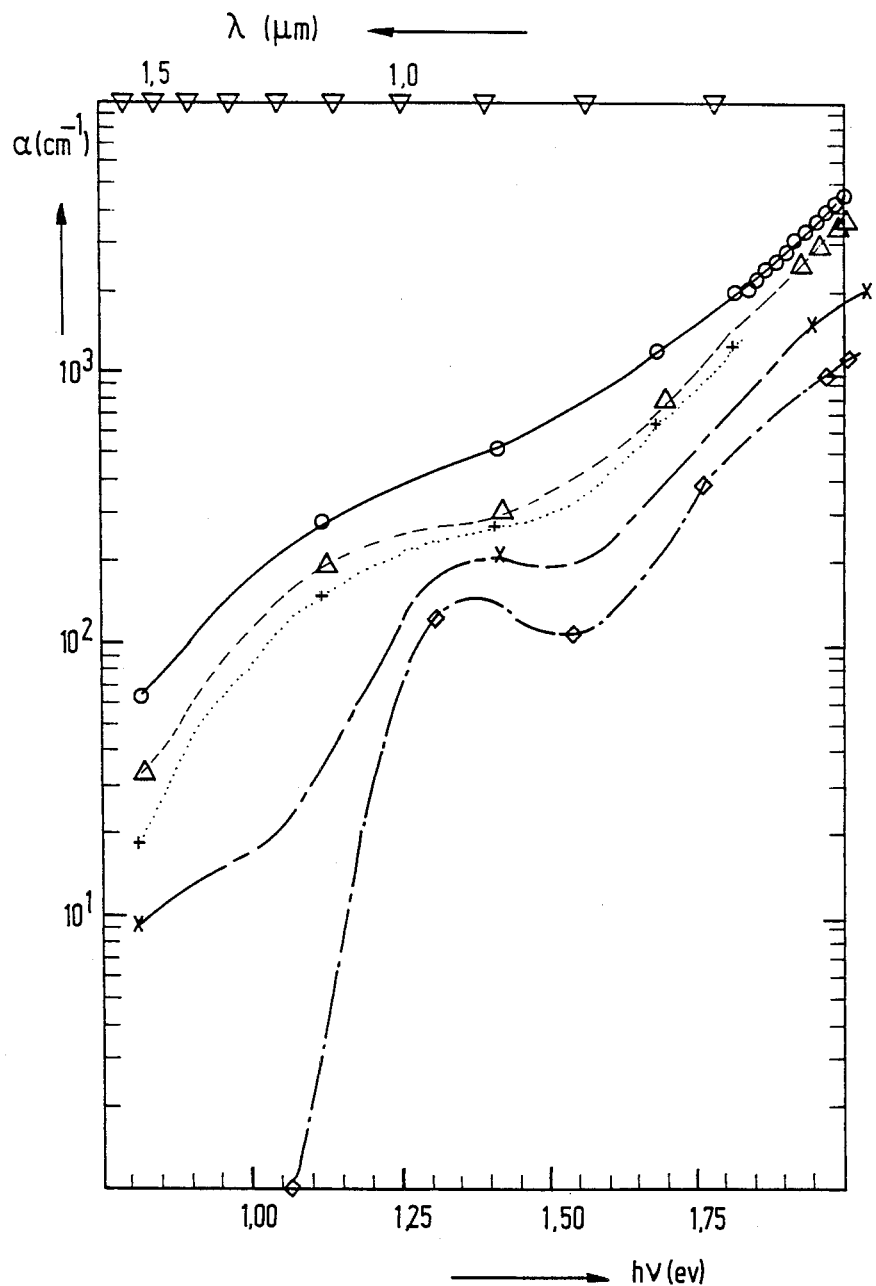
FIG. 3 is a diagram of the intrinsic absorption α of the materials used in a stripline waveguide according to the invention.

FIG. 3 depicts the intrinsic absorption α (1/cm) of monocrystalline and amorphous bismuth-substituted gandolinium iron garnet which is deposited in situ, a part of the iron being substituted by aluminium and gallium, as a function of the wavelength $\lambda$ (μm) and the photon energy $h_\nu$ (eV). In the Figure the following data are plotted in succession from the bottom to the top: a monocrystalline material (growth temperature 520° C.), the same material after it has been tempered for half an hour at 690° C., 660° C. and 550° C., and an amorphous material (deposition temperature 360° C.). From the Figure it becomes apparent that the degree of intrinsic absorption α of the monocrystalline iron garnet material manufactured by means of RF cathode sputtering is very low for the use of the waveguide relevant wavelength range over 1 μm. The amorphous iron garnet, however, has a degree of absorption which allows it to be used as an absorbing layer to suppress undesired modes. Moreover, the absorption $\alpha_1$ of the amorphous iron garnet material can be approached in the present method by tempering at a temperature which is close to the crystallization temperature of the absorption $\alpha_2$ of the monocrystalline material, which is important for the manufacture of low-loss stripline waveguides of the channel waveguide type.

By way of example, a description is given of the manufacture of stripline waveguides for non-reciprocal optical components, having monocrystalline waveguide strips, and the material surrounding them which is of different order and which consists of bismuth-substituted gandolinium iron garnet, a part of the iron being substituted by aluminium and gallium.

In (111)-direction or (110)-direction oriented calcium magnesium zirconium-substituted gandolinium gallium garnet single crystal discs 1 having a diameter of 30 mm were used as substrates, which discs were pretreated in known manner before the deposition process, such that epitaxial growth can take place. A first monocrystalline layer 5 (see FIGS. 4-6) of bismuth-substituted gandolinium iron garnet is deposited on these substrates by means of RF cathode sputtering, a part of the iron being substituted by aluminium and gallium. This iron garnet layer 5 is deposited by means of the same target as that which is used for the later manufacture of monocrystalline waveguide strips 99 and the material 97 surrounding them. A refractive index $n_1$ is imparted to this first iron garnet layer 5 by a suitable selection of the sputtering parameters, which refractive index $n_1$ is lower than the refractive index $n_2$ of the monocrystalline waveguide strip material to be deposited afterwards on this iron garnet layer because in comparison with the conditions under which the monocrystalline waveguide strip is deposited a higher RF voltage is applied to the target electrode and/or the pressure of the inert gas plasma is increased and/or the substrate temperature is raised and/or an RF voltage (substrate bias) is applied to the substrate electrode. To deposit the first monocrystalline iron garnet layer 5, a helium-group gas, preferably argon, having a pressure of 0.6 Pa is introduced into the sputtering equipment which is evacuated to a pressure of $<10^{-5}$. Such a layer having a refractive index $n_1$ smaller than that of the waveguide strip to be provided next is required to obtain single mode propagation in the strip-line waveguide to be manufactured. A pressure difference of the inert gas plasma of, for example, approximately 0.5 Pa leads to a refractive index step of approximately $5 \cdot 10^{-3}$. In order to produce a a locally disturbed lattice structure, the areas of the substrate on which the waveguide strip is to grow epitaxially and whose lattice structure is consequently not to be disturbed are subsequently provided, or before the first epitaxial iron garnet layer 5 is applied, with a photoresist mask, and the substrate is subjected to an ion bombardment in a helium-group gas plasma having a pressure from 0.1 to 1 Pa, preferably 0.2 Pa, at an ion energy of $>30$ eV, preferably some $10^2$ eV. Subsequently the photoresist mask is removed. The other parameters of the method correspond to those which will be described hereinafter with respect to the manufacture of monocrystalline waveguide strips and the material surrounding them.

A body of iron garnet mixed oxides which is manufactured by hot pressing or sintering is used as a target (cathodic sputtering source), said body having a diameter of 7.5 cm, a thickness of 4 mm, a porosity of $<10\%$ and, preferably, a saturation magnetization $M_s$ of $<25$ G.

In the following examples of embodiments powdered mixtures of $BiFeO_3$, $Gd_2Bi_1Fe_5O_{12}$, $Al_2O_3$ and $Ga_2O_3$ are sintered in an oxygen atmosphere having a pressure of 1 bar for 6 hours at a temperature $<920°$ C., for process being conducted so that there is substantially no residual free $Bi_2O_3$ in the ceramic structure. Free $Bi_2O_3$ must not be present in the target because it will lead to mechanical disintegration of the surface of the target due to the fact that it has a higher sputtering rate than the other target constituents; thanks to the use of mixed oxides a homogenization of the sputtering rate of all phase constituents of the target is obtained.

EXAMPLE I

For the manufacture of monocrystalline single-phase iron garnet waveguide strips and the amorphous material surrounding them of the composition $Gd_{1.90}Bi_{1.45}Fe_{4.09}Al_{0.34}Ga_{0.22}O_{12}$ a target having a diameter of 7.5 cm and of the following composition is used (quantities in % by weight):
$Gd_2O_3$:33.64
$Bi_2O_3$:31.80
$Fe_2O_3$:31.52
$Al_2O_3$:1.15
$Ga_2O_3$:1.89

The target body is attached to the target electrode by means of a satisfactorily heat-conducting adhesive (for example epoxy resin filled with silver power).

In order to conduct away dissipated heat it is efficacious to use, for example, water-cooled target electrodes.

The deposition process is conducted so that the sputtering equipment is first evacuated by means of a vacuum pump to a pressure $<10^{-3}$ Pa, after which a helium-group gas, preferably argon, having a pressure of 0.6 Pa is introduced. The distance between the target and the substrate is 80 mm. The deposition rate is approximately 0.8 $\mu$m/h. The RF voltage measured at the RF supply lead on the rear side of the target electrode is 230 $V_{rms}$; the substrate voltage is floating. The substrate temperature is 480° C.

EXAMPLE II

For the manufacture of monocrystalline single-phase iron garnet waveguide strips and the amorphous material surrounding them of the composition $Gd_{1.97}Bi_{1.04}Fe_{4.51}Ga_{0.22}Al_{0.26}O_{12}$ a target having a diameter of 7.5 cm and of the following composition is used (quantities in % by weight):
$Gd_2O_3$:36.514
$Bi_2O_3$:24,122
$Fe_2O_3$:36,074
$Al_2O_3$:1.220
$Ga_2O_3$:2,070

As described with respect to Example I, the target body is attached to the target electrode. It is also efficacious to use water-cooled target electrodes to conduct away dissipated heat. The coating process is carried out as described with respect to Example I, however, the substrate temperature was 510° C.

Before the layers are deposited (typical layer thicknesses are from 1 to 5 $\mu$m) the target is pre-etched by an ion bombardment from the plasma until the target material thus removed has a constant composition. In further experiments with the same target the pre-etching time is reduced from approximately 5 h to some 10 m, until the equilibrium potential has stabilized at the target.

After deposition in the cathode-sputtering device, layers are obtained which are amorphous, X-ray amorphous or polycrystalline on the substrate regions with a lattice disorder, and which are monocrystalline on the substrate regions with a monocrystalline, undisturbed crystal lattice.

FIGS. 4, 5, 6 and 7 schematically show stripline waveguide structures as they are produces according to the present method.

Figure 4:
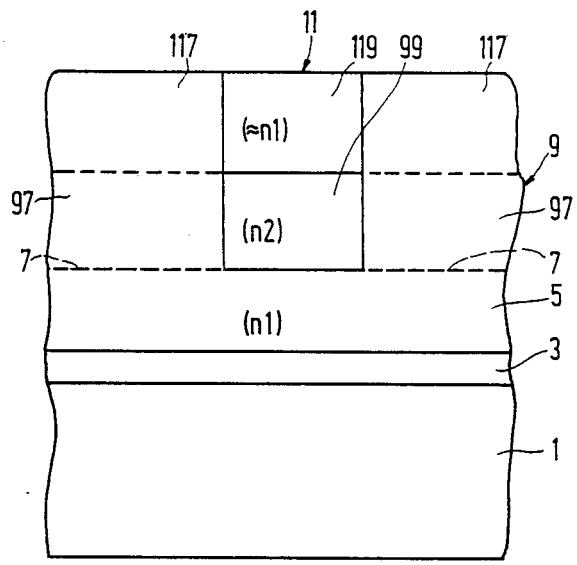
FIGS. 4 to 7 are sectional views of stripline waveguides according to the invention.

In FIG. 4 a cobalt-substituted iron garnet layer 3 is first provided on a non-magnetic, (110)-oriented gadolinium gallium garnet substrate 1, preferably by liquid phase epitaxy; said layer 3 prevents the development of higher wavemodes, caused by a higher degree of absorption, at the interface with the substrate. As has been stated above, the proper functioning of single-mode waveguides requires the suppression of undesired modes, the stripline waveguide not having to be completely surrounded by the absorbing material. As an alternative to the above-mentioned cobalt substituted monocrystalline iron garnet layer, an amorphous iron garnet absorbing layer produced by means of RF cathode sputtering may be used, which layer is provided over the stripline waveguide structure (see FIG. 7).

As described above, the first monocrystalline iron garnet layer 5 is then provided by means of RF cathode sputtering. As described above, the thus prepared substrate 1, 3, 5 is disturbed by ion bombardment in the near-surface lattice regions; in FIG. 4 these regions are indicated by reference numeral 7, in the later deposition process an iron garnet layer 9 with amorphous or polycrystalline regions 97 is grown on these regions. In the later deposition process, iron garnet is grown in a monocrystalline manner in the non-disturbed lattice regions of the layer 5, thereby forming a waveguide strip 99. Subsequently, a further iron garnet layer 11 is deposited also by means of RF cathode sputtering using the same target as for the manufacture of the waveguide strip 99 and the amorphous or polycrystalline regions 97, which iron garnet layer grows in a monocrystalline manner in the region 119 over the waveguide strip 99 and in an amorphous or polycrystalline manner in the regions 117 over the amorphous or polycrystalline regions 97. This further iron garnet layer 11 is provided with a lower refractive index $n_1$ than the iron garnet layer 9 because in comparison with the manufacturing conditions of the iron garnet layer 9, for the deposition of the iron garnet layer 11 either a higher RF voltage is applied to the target electrode, the inert gas plasma pressure is increased, the substrate temperature is higher or an RF voltage (substrate bias), for example 25 $v_{rms}$, is applied to the substrate electrode. In the present example, an inert gas plasma pressure of 1.0 Pa and a substrate temperature in the range from 480° to 540° C. were used to deposit the further iron garnet layer 11. At a substrate temperature of 480° C. the iron garnet layer 11 grows amorphously in the regions 117, at a substrate temperature >540° C. this iron garnet layer grows in a polycrystalline manner in the regions 117.

Figure 5:
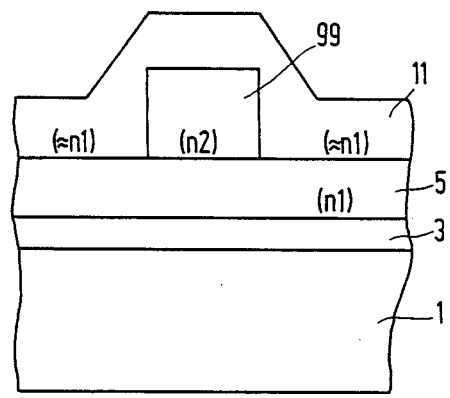

FIG. 5 shows a part of a further embodiment of a stripline waveguide manufactured according to the inventive method. Up to the manufacture of the layer 9 the process steps are the same as described with respect to FIG. 4; as shown in FIG. 4 the layer 9 has a mono crystalline waveguide strip 99 and next thereto, for example, amorphous regions 97. The system thus obtained which comprises the substrate 1,3,5 and the layer 9 is etched in a subsequent chemical etching process in $H_3PO_4$ at a temperature of $\approx 150°$ C., in which process the amorphous layer portions 97 are removed and the waveguide strip 99 remains in tact due to the etching rate which is approximately a factor of five lower than that of the amorphous material of the layer portions 97. On the structure thus obtained comprising substrate 1, 3, 5 and monocrystalline waveguide strip 99 the further monocrystalline iron garnet layer 11, as described with respect to FIG. 4, is provided in a subsequent process step by means of RF cathode sputtering.

A semi-leaky optical isolator (as described in I.E.E.E. J. Quantum Electro OE-18, 1982, page 1975) which exhibits single-mode propagation is obtained, for example, when the monocrystalline waveguide strip 99 has a cross-section $\gtrsim 3,5 \times 3,5$ $\mu m^2$ at a refractive index step $n_2 - n_1 \lesssim 5 \cdot 10^{-3}$ for the mode in question, whereas for the mode to be leaked out the refractive index step $n_2 - n_1$ must be $\lesssim 0$. In order to arrive at low propagation losses in the isolator, the value of the intrinsic absorption $\alpha_1$ of the material surrounding the waveguide strip must approach the small intrinsic absorption value $\alpha_2$ of the material of the monocrystalline waveguide strip 99, and the interface between the monocrystalline waveguide strip 99 and the material surrounding it must be very smooth. The absorption values $\alpha_1$, $\alpha_2$ of the materials of the monocrystalline waveguide strip 99 and the further monocrystalline layer 11 are almost the same.

The necessary refractive index step $n_2 - n_1 \lesssim 5 \cdot 10^{-3}$ or the mode in question can be obtained by means of different substrate temperatures during the deposition process of the monocrystalline stripline waveguide 99 and the further monocrystalline layer 11; a change in the substrate temperature $\Delta T = 50$ K. leads to, for example, a change in the lattice constants $a_2$ of the waveguide strip 99 with respect to the lattice constants $a_1$ of the substrate layer 5 of $\Delta a^{\perp} \approx 0.001$ nm, which leads to a value $\Delta n^{\perp} \approx 5 \cdot 10^{-4}$ due to a change in the crystal lattice mismatch. The change in the refractive index can mainly be attributed, however, to the ensuing change in the bismuth content of the layer. This change in the refractive index is approximately $10^{-3}$.

The refractive indices $n_2$ of the material of the waveguide strip 99 and $n_1$ of the material of the further monocrystalline layer 11 can be coarsely adjusted by applying a voltage (substrate-bias) in the range from 20 to 30 $V_{rms}$ to the substrate electrodes; in this way, values of $\Delta n \approx 10^{-1}$ to $10^{-2}$ are obtained. When the stripline waveguide according to the invention is employed as a semi-leaky optical isolator the required refractive index step $n_2 - n_1 \lesssim 0$ of the modes to be leaked out is obtained in that the waveguide strip is at least partly surrounded by material of non-monocrystalline order or in that the waveguide strip is at least partly surrounded by material of monocrystalline order having a crystal lattice constant similar to that of the material of the stripline waveguide.

In the case of the stripline waveguide of FIG. 4, the refractive index step $n_2 - n_1$ is adjusted as described with respect to FIG. 5. As the material of the monocrystalline waveguide strip 99 has an absorption value $\alpha_2$ which differs from the value $\alpha_1$ of the amorphous material of the regions 97 surrounding it, $\alpha_1$ and $\alpha_2$ must be equalized. This can be achieved in a tempering process after deposition of the material for the waveguide strip 99 and the material surrounding it of the regions 97, according to the diagram plotted in FIG. 3.

Figure 6:
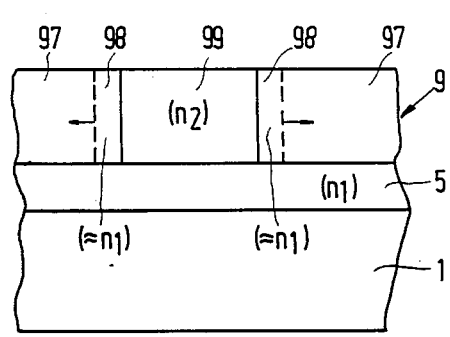

FIG. 6 shows a portion of a further stripline waveguide manufactured according to the inventive method. As described above, the first monocrystalline iron garnet layer 5 is provided by means of RF cathode sputtering on a non-magnetic, (111)-oriented gadolinium gallium garnet substrate 1.

The thus prepared substrate 1,5 is, as described above, disturbed near surface lattice regions by ion bombardment. Subsequently, the iron garnet layer 9 with the amorphous regions 97 and the waveguide strip 99 which is grown in a monocrystalline manner on the undisturbed regions of the substrate 1,5 are deposited, as described above, by means of RF cathode sputtering. In a subsequent tempering process at a temperature just below the crystallization temperature of the amorphous material of the regions 97, monocrystalline border zones in the form of a cladding 98 are formed at the interface between the monocrystalline waveguide strip 99 and the adjacent amorphous material of the regions 97 by epitaxial growth on the sides of the monocrystalline waveguide strip 99. The tempering process is continued until the cladding 98, which grows in a monocrystalline manner, has obtained the desired thickness. The refractive index $n_1$ of the cladding 98 is lower than the refractive index $n_2$ of the monocrystalline waveguide strip 99; the reason for this is, that as the amorphous regions have less surface binding energy they are subject to a higher degree of back-sputtering of elements with a very low sputtering rate (for example bismuth), and consequently their composition slightly differs from that of the material of the monocrystalline waveguide strips 99. This after-treatment by tempering may alternatively be carried out after a further thick, amorphous iron garnet layer 11 (for example having a thickness of 5 μm) has been deposited on the iron garnet layer 9, such that a monocrystalline region having a refractive index similar to the refractive index $n_1$ of the layer 5 but smaller than the refractive index $n_2$ of the waveguide strip 99 is formed over the waveguide strip 99. Due to the fact that only the region of the amorphous further iron garnet layer 11 which is situated over the waveguide strip 99 has a monocrystalline order after the tempering process, the remaining regions of the further iron garnet layer 11 which are situated over the regions 97 of the iron garnet layer 9 can act as absorbers.

Figure 7:
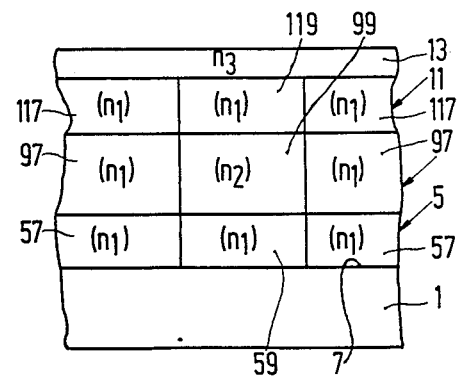

FIG. 7 shows a further stripline waveguide manufactured according to the present method. The lattice structure of a non-magnetic, (110)—oriented gadolinium gallium garnet single crystal disc 1 was disturbed in the regions 7 to a depth of several atom layers by an iron bombardment in an argon plasma at a pressure 0.2 Pa and an ion energy of some $10^{-2}$ eV, in which process the regions of the single crystal disc which were not to be disturbed by the ion bombardment were masked by means of a photosensitive layer. After the removal of the photosensitive layer the first iron garnet layer 5 was provided in a continuous production cycle by means of cathode sputtering, which layer will grow in an amorphous or polycrystalline manner in the regions 57 and in a monocrystalline manner in the region 59. The process parameters relating to the fabrication of the iron garnet layer 5 have been described hereinbefore with the reference to the FIGS. 4 to 6. Subsequently, the iron garnet layer 9 having amorphous or polycrystalline regions 97 and the monocrystalline region which forms the waveguide strip 99, and the further iron garnet layer 11 having amorphous or polycrystalline regions 117 and a monocrystalline region 119 as described hereinbefore, are provided. After deposition of the further iron garnet layer 11 an amorphous iron garnet layer whose composition corresponds to that of the waveguide strip 99 is deposited as an absorbing layer to which a refractive index $n_3$ is imparted which is equal or higher than the refractive index $n_1$ of the further iron garnet layer 11, because in comparison with the conditions under which the further iron garnet layer 11 is deposited, a lower pressure of the inert gas plasma and a lower substrate temperature are applied. The amorphous absorbing layer 13 is deposited at a pressure of 0.2 Pa and a substrate temperature of 250° C.

In order to obtain a semi-leaky structure for a semi-leaky optical isolator, the following measures are taken: the waveguide strip 99 is deposited epitaxially on the region 59 of the iron garnet layer 5 to obtain the optical birefrigence which is necessary for the proper functioning of a semi-leaky optical isolator by selecting the free lattice constants a of the substrate 1 and the layer region 59 so that they are different from the free lattice constants a of the waveguide strip 99. Preferably, the free lattice constant a of the waveguide strip 99 is larger than the free lattice constant a of the substrates. On the other hand, the lattice of at least one region adjacent to the waveguide strip 99, for example the regions 97 or the region 119, should be isolated from the waveguide strip 99, i.e. such regions should not be deposited epitaxially in order not to produce birefrigence there in. In this case, the requirement is met that at the interfaces between the waveguide strip 99 and the regions 97 or between the waveguide strip 99 and the region 119 the refractive index for the mode employed, for example the TM mode, is lower in the regions 97 and/or the region 119 than in the waveguide strip 99, whereas for the leady mode, for example the TE mode, the refractive index is higher in the regions 97 and/or 119. These conditions can be fulfilled because with the present method not only epitaxial regions but also regions of a different order, for example amorphous or polycrystalline, can be produced simultaneously.

What is claimed is:

1. A method of manufacturing an optical stripline waveguide for non-reciprocal optical components comprising the steps of
   providing a crystallographically oriented substrate,
   forming a first monocrystalline iron garnet layer on said substrate by RF cathode scattering in an inert gas plasma using a target of mainly an iron garnet phase together with other phases of almost equal sputtering rate, said first layer having a first index of refraction $n_1$,
   epitaxially growing a monocrystalline waveguide strip material on said first layer RF cathode sputtering with said target, said waveguide strip having a second index of refraction $n_2$, where $n_2 > n_1$.
   locally disturbing the lattice structure of the surface free of said waveguide strip to form a lattice disorder, and
   surrounding said waveguide strip with iron garnet material having said first index of refraction $n_1$.

2. A method as claimed in claim 1, characterized in that a (111)-oriented non-magnetic garnet single crystal disc (1) is used as a substrate.

3. A method as claimed in claim 1, characterized in that a (110)-oriented non-magnetic garnet single crystal disc 1 is used as a substrate.

4. A method as claimed in claim 2 or 3, characterized in that a calcium magnesium zirconium-substituted gadolinium gallium garnet $(Gd,Ca)_3(Ga,Mg,Zr)_5O_{12}$ is used as a substrate.

5. A method as claimed in claim 2 or 3, characterized in that a monocrystalline cobalt-substituted iron garnet layer is first provided on the garnet single crystal disc 1 as an absorbing layer (3).

6. A method as claimed in claim 5, characterized in that the absorbing layer (3) is provided by means of liquid phase epitaxy.

7. A method as claimed in claim 1, characterized in that the monocrystalline waveguide strip 99 and the material surrounding it (5), (11), (97) have a composition according to the general formula $(A, B)_3(A, B)_5O_{12}$, where
A = at least one rare earth metal, Bi, Pb and/or Ca
B = Ga,Al,Fe,Co,Ni,Mn,Ru,Ir,In and/or Sc.

8. A method as claimed in claim 7, characterized in that the monocrystalline waveguide strip (99) and the material surrounding it (5), (11), (97) have a composition according to the formula $Gd_{1.90}Bi_{1.45}Fe_{4.09}Al_{0.34}Ga_{0.22}O_{12}$.

9. A method as claimed in claim 7, characterized in that the monocrystalline waveguide strip (99) and the material surrounding it (5), (11), (97) have a compostion according to the formula $Gd_{1.97}Bi_{1.04}Fe_{4.51}Ga_{0.22}Al_{0.26}O_{12}$.

10. A method as claimed in claim 1, characterized in that the monocrystalline waveguide strip (99) and the material surrounding it (5), (11), (97) are deposited in an inert gas plasma having a pressure from 0.2 to 2.0 Pa at ion energy of the particles which bombard the growing layer from approximately 10 to $10^2$ eV.

11. A method as claimed in claim 1, characterized in that the material (97) which laterally surrounds the waveguide strip (99) is amorphous.

12. A method as claimed in claim 11, characterized in that in the epitaxy process the substrate is heated to a temperature which is higher than the temperature at which epitaxial growth starts on substrate regions having an undisturbed crystal lattice, and lower than the temperature at which polycrystalline growth starts on substrate regions having a disturbed crystal lattice (7).

13. A method as claimed in claim 12, characterized in that the substrate is heated to a temperature in the range from 450° to 520° C.

14. A method as claimed in claim 11, characterized in that the system comprising the substrate, the monocrystalline waveguide strip (99) and the amorphous material (97) surrounding the latter is subjected to a tempering process at a temperature at which lateral epitaxial grow takes place from the sides of the waveguide strip to the amorphous material surrounding it, such that along the sides of the waveguide strip a monocrystalline cladding (98) having a thickness of several $\mu m$ is formed.

15. A method as claimed in claim 14, characterized in that the tempering process is carried out within a temperature range of about 50 K. below the crystallization temperature of the amorphous material.

16. A method as claimed in claim 1, characterized in that the material (97) which laterally surrounds the waveguide strip (99) is polycrystalline.

17. A method as claimed in claim 16, characterized in that the substrate is heated to a temperature which is higher than the temperature at which polycrystalline growth starts on substrate regions having a disturbed crystal lattice (7).

18. A method as claimed in claim 17, characterized in that the substrate is heated to a temperature >520° C.

19. A method as claimed in claim 1 characterized in that the deposition of said first monocrystalline iron garnet layer (5) of the same material is carried out by RF cathode sputtering, which layer is provided with a refractive index $n_1$ which is lower than the refractive index $n_2$ of the waveguide strip because in comparison with the conditions under which the monocrystalline waveguide strip is deposited at least one of a higher RF voltage is applied to the target electrode and the pressure of the inert gas plasma is increased and the substrate temperature is raised and an RF voltage (substrate bias) is applied to the substrate electrode.

20. A method as claimed in claim 19, characterized in that the lattice structure of the substrate in the form of a garnet single crystal disc (1) of or the lattice structute of a monocrystalline absorbing layer (3) which is provided on an undisturbed garnet single crystal disc or the lattice structure of a first monocrystalline iron garnet layer (5) which is provided on an undisturbed monocrystalline absorbing layer is disturbed by an ion bombardment from an inert gas plasma to a depth of several atom layers in those regions (7) where no waveguide strip should be grown epitaxially.

21. A method as claimed in claim 20, characterized in that the regions (7) which are not to be disturbed by ion bombardment are covered with a photoresist mask, after which the ion bombardment is carried out in a helium-group gas plasma at a pressure from 0.1 to 1 Pa and an ion energy >30 eV for several minutes.

22. A method as claimed in claim 21, characterized in that the ion bombardment is carried in an argon plasma at a pressure of 0.2 Pa and an ion energy of some $10^2$ eV.

23. A method as claimed in claim 1, characterized in that the deposition of the material forming the waveguide strip (99) is followed by the deposition of a further iron garnet layer (11) of the same material by RF cathode sputtering, which layer grows in a monocrystalline manner on the waveguide strip and in an amorphous or polycrystalline manner on the material which laterally surrounds this waveguide strip, and to which a refractive index $n_1$ is imparted which is lower than the refractive index $n_2$ of the waveguide strip, because in comparison with the conditions under which the monocrystalline waveguide strip is deposited at least one of a higher RF voltage is applied to the target electrode and the pressure of the inert gas plasma is increased and the substrate temperature is raised and an RF voltage (substrate bias) is applied to the substrate electrode.

24. A method as claimed in claim 1, characterized in that the material (97) which laterally surrounds the waveguide strip (99) is removed in a subsequent etching step, and by RF cathode sputtering a further monocrystalline iron garnet layer (11) of the material forming the waveguide strip is deposited next to and on the waveguide strip which obtains a refractive index $n_1$ which is lower than the refractive index $n_2$ of the waveguide strip because in comparison with the conditions under which the monocrystalline waveguide strip is deposited at least one of a higher RF voltage is applied to the target electrode and the pressure of the inert gas plasma is increased and the substrate temperature is raised and an RF voltage (substrate bias) is applied to the substrate electrode.

25. A method as claimed in claim 23 or 24, characterized in that the further iron garnet layer (11) is deposited in an inert gas plasma having a pressure from 0.2 to 2.0 Pa, the ion energy of the particles which bombard the growing layer being from approximately 10 to $10^2$ eV.

26. A method as claimed in claim 23 or 24, characterized in that an amorphous iron garnet layer having a composition which corresponds to that of the waveguide strip (99) is deposited as an absorbing layer (13) on the further iron garnet layer (11), be RF cathode sputtering, to which amorphouse iron garnet layer a refractive index $n_3$ is imparted which is the same or higher than the refractive index $n_1$ of the further iron garnet layer, because in comparison with the conditions under which the further iron garnet layer is deposited at least one of the pressure of the inert gas plasma is reduced and the substrate temperature is lowered.

27. A method as claimed in claim 26, characterized in that the amorphous absorbing layer (13) is deposited in an inert gas plasma having a pressure in the range from 0.1 to 1.0 Pa.

28. A method as claimed in claim 26, characterized in that the amorphous absorbing layer (13) is deposited at a substrate temperature in the range from 200° to 450° C.

29. A method as claimed in claim 1, characterized in that the RF cathode sputtering process is carried out in a helium-group gas plasma.

30. A method as claimed in claim 1, characterized in that a magnetron is used as a target electrode, to which the RF power necessary for the sputtering process to applied.

31. A method of forming a semileaky optical isolator using an optical stripline waveguide according to claim 1, comprising the step of forming said waveguide strip with free lattice constants larger than free lattice constants of said first layer and said substrate to obtain optical birefringence, wherein at least one region of said surrounding material adjacent to said waveguide strip is free of said birefringence, and wherein optical modes to be leaked out of said waveguide strip have a refractive index step of $n_2 - n_1 \leq 0$.

* * * * *